United States Patent [19]
Kwon et al.

[11] Patent Number: 5,886,550
[45] Date of Patent: Mar. 23, 1999

[54] INTEGRATED CIRCUIT BUILT-IN TYPE SUPPLY POWER DELAY CIRCUIT

[75] Inventors: Jong-Kee Kwon, Daejeon, Rep. of Korea; Gyu-Dong Kim, Palo Alto, Calif.; Ook Kim, Seoul, Rep. of Korea; Chang-Jun Oh, Daejeon, Rep. of Korea; Jong-Ryul Lee, Daejeon, Rep. of Korea; Won-Chul Song, Daejeon, Rep. of Korea; Kyung-Soo Kim, Daejeon, Rep. of Korea

[73] Assignee: Electronics and Telecommunications Research Institute, Daejeon, Rep. of Korea

[21] Appl. No.: 877,408

[22] Filed: Jun. 16, 1997

[30] Foreign Application Priority Data

Nov. 27, 1996 [KR] Rep. of Korea ....................... 96-58509

[51] Int. Cl.$^6$ .................................................. H03K 17/22
[52] U.S. Cl. ........................................... 327/143; 327/198
[58] Field of Search ..................................... 327/143, 198, 327/546

[56] References Cited

U.S. PATENT DOCUMENTS

| 4,633,107 | 12/1986 | Norsworthy | 307/594 |
| 5,093,756 | 3/1992 | Kim | 361/195 |
| 5,374,923 | 12/1994 | Sakamoto | 340/654 |
| 5,528,182 | 6/1996 | Yokosawa | 327/143 |
| 5,612,641 | 3/1997 | Sali | 327/143 |

*Primary Examiner*—Timothy P. Callahan
*Assistant Examiner*—Maria Hasanzadah
*Attorney, Agent, or Firm*—Cohen, Pontani, Lieberman & Pavane

[57] ABSTRACT

An integrated circuit built-in type power delay circuit which is capable of supplying a stable supply power to each circuit of the integrated circuit by generating a supply power control signal voltage after a predetermined time. The circuit includes a receiving unit for receiving a supply voltage VDD and charging the same, a supplying unit for supplying a current, an inverting unit for inverting an output value from the charging unit, a switching unit controlled in accordance with an output value from the inverting unit for switching an output from the current supply unit, a current regenerating unit for receiving a control of the switching unit and discharging an output value from the charging unit, an electric potential value conversion unit controlled by an output value from the inverting unit for converting an output value from the charging unit into a low level, and a buffering unit for receiving an output value from the inverting unit for buffering the output value and outputting a non-inverted signal.

9 Claims, 3 Drawing Sheets

5,886,550

INTEGRATED CIRCUIT BUILT-IN TYPE SUPPLY POWER DELAY CIRCUIT

BACKGROUND OF THE INVENTION

1. Field of the Invention

The present invention relates to an integrated circuit built-in type supply power (power-on) delay circuit, and in particular, to an improved integrated circuit built-in type supply power delay circuit which is capable of supplying a stable power by implementing a regeneration operation based on a delay and negative feedback by a current discharging in a capacitance or MOS capacitance.

2. Description of the Conventional Art

Conventionally, the integrated circuit built-in type power supply (power-on) delay circuit is a circuit for delaying a power supply for a predetermined time when an unstable power is supplied to the circuit, and then supplying a stable electric power to each element of the circuit.

In particular, a bias circuit which generates an accurate reference voltage and current and a power supply-sensitive circuit need a stable electric power supply. Generally, since the power supply greatly affects the stability of the entire circuit, much study has been intensively performed on the method of stabilizing the supply power.

As one of the conventional methods, there is a method of using a control logic such as a flip-flop for charging/discharging a capacitor in a supply power reset circuit and checking the operational state by using a comparator. In addition, there is a sequence power delay circuit which includes a complicated time delay rectifier and a relay unit with respect to an alternating current (AC).

However, the conventional supply power delay circuit has a complicated construction, and when additional devices are used in an electronic system, the supply power delay circuit is disposed in an integrated circuit, for thus complicating the configuration of the circuit.

SUMMARY OF THE INVENTION

Accordingly, it is an object of the present invention to provide an integrated circuit built-in type supply power delay circuit which overcomes the aforementioned problems encountered in the conventional art.

It is another object of the present invention to provide an improved integrated circuit built-in type supply power delay circuit which is capable of providing a simple construction of the circuit.

It is another object of the present invention to provide an improved integrated circuit built-in type power delay circuit which is capable of supplying a stable power by implementing a regeneration operation based on a delay and negative feedback by a current discharging in a capacitance or MOS capacitance.

It is another object of the present invention to provide an improved integrated circuit built-in type power delay circuit which is capable of supplying a stable supply power to each circuit of the integrated circuit by generating a supply power control signal voltage after a predetermined time.

To achieve the above objects, there is provided an integrated circuit built-in type supply power delay circuit which includes a receiving unit for receiving a supply voltage VDD and charging unit for charging the same, a supplying unit for supplying a current, an inverting unit for inverting an output value from the charging unit, a switching unit controlled in accordance with an output value from the inverting unit for switching an output from the current supply unit, a current mirroring unit for receiving a control of the switching unit and discharging an output value from the charging unit, an electric potential value conversion unit controlled by an output value from the inverting unit for converting an output value from the charging unit into a low level, and a buffering unit for receiving an output value from the inverting unit for buffering the output value and outputting an inverted or a non-inverted signal, wherein the charging unit includes a PMOS transistor, the gate of which receives a supply power VDD, and the source and drain of which connected to each other, for charging the voltage up to a level of the supply power voltage VDD.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
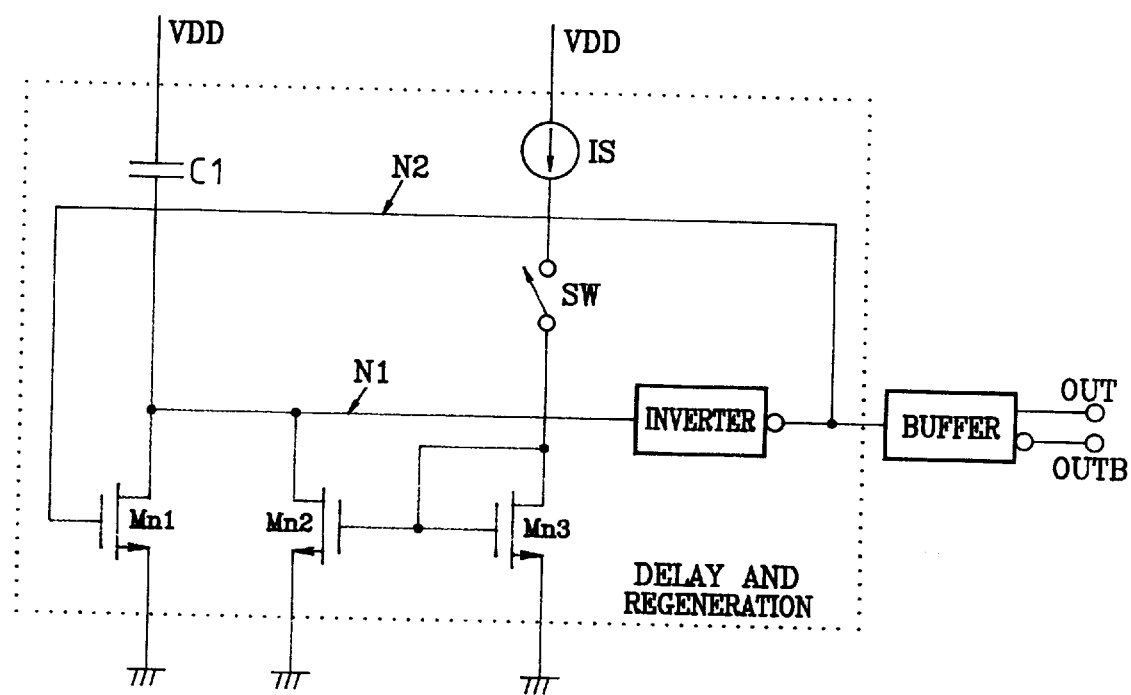
FIG. 1 is a circuit diagram illustrating an integrated circuit built-in type supply power (power-on) delay circuit according to the present invention.
Figure 2:
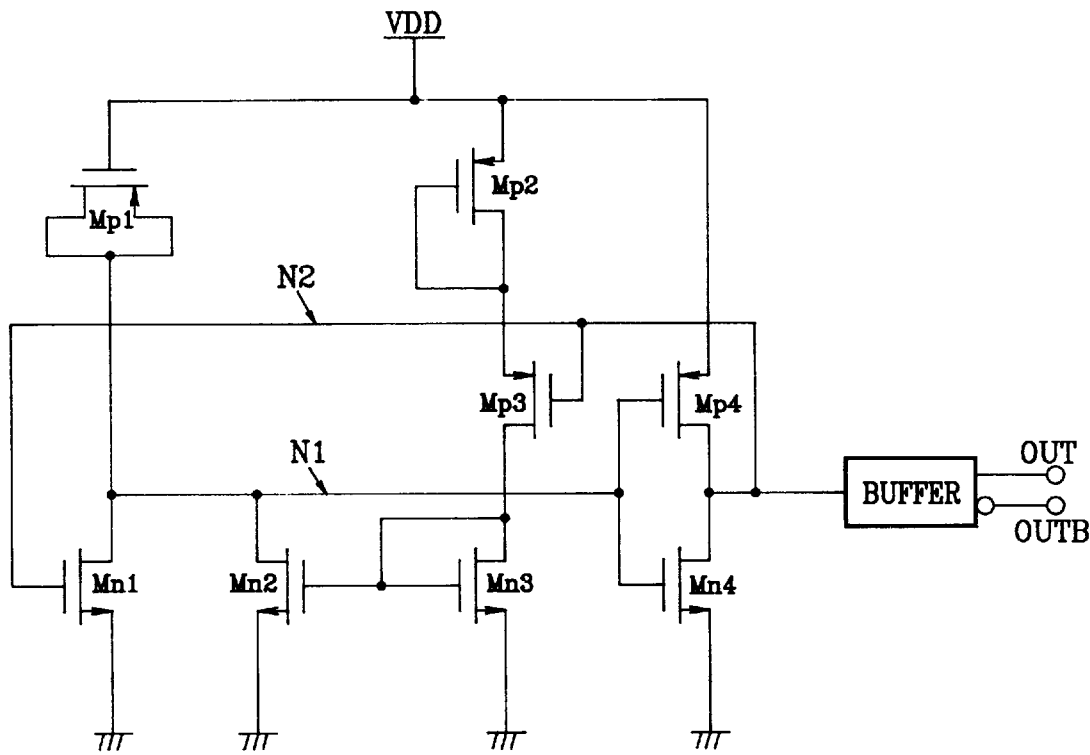
FIG. 2 is a detailed circuit diagram illustrating an integrated circuit built-in supply power delay circuit according to the present invention.

FIG. 1 illustrates an integrated circuit built-in type supply power (power-on) delay circuit according to the present invention, and FIG. 2 illustrates an integrated circuit built-in supply power delay circuit according to the present invention.

As shown therein, the supply power delay circuit according to the present invention includes a delay and regeneration circuit and a buffer circuit. The delay and regeneration circuit includes a MOS capacitance, a current source and switch, a current mirror, and a CMOS inverter. An output buffer includes two inverters for generating inverted or non-inverted output voltages.

When the supply power is supplied, the regeneration circuit acts to generate a very stable power control signal after a predetermined time as a regeneration is operated by a current-capacitance delay operation and a negative feedback.

The supply power delay circuit according to the present invention further includes a capacitor C1 and an NMOS transistor Mn2 of the delay circuit, and a switch SW connecting a current source $I_S$ to current mirror consisted of NMOS transistors Mn3 and Mn2, inverter unit which consists a negative feedback circuit.

Referring to FIGS. 2 and 4, the operation of the supply power delay circuit according to the present invention will now be explained.

When a supply power VDD is supplied to the circuit at the time t1, the voltage level $V_N1$ of a node N1 becomes a voltage level which is closed to the voltage VDD through parasitic capacitances established between the gate of the PMOS transistor Mp1 and both ends of the source/drain of it(PMOS transistor Mp1).

In addition, the voltage level $V_N2$ at a node N2 becomes a ground electric potential state by the inverter including the PMOS transistor Mp4 and the NMOS transistor Mn4. At this time, the PMOS transistor Mp3 which acts as an on/off switch between the current source and the current mirror is made conductive, and the NMOS transistor Mn1 is made non-conductive.

The current which was charged into the gate capacitance of the PMOS transistor Mp1 by the supply power voltage VDD is slowly discharged through a long channel NMOS transistor Mn2.

At this time, the level of the discharging current is determined by the size of the PMOS transistor Mp2 which is the current source and by the sizes of the NMOS transistors Mn3 and Mn2 of the current mirror and by the power voltage VDD.

Therefore, the level of the voltage $V_{N1}$ at the node N1 is slowly lowered until the voltage level $V_{N1}$ at the node N1 becomes approximately identical to the level of the threshold voltage Vth of the NMOS transistor Mn4 of the inverter at the time t2 of FIG. 4.

At this time, the voltage level $V_{N1}$ at the node N1 is applied to the inverter as an input signal, and the output from the inverter is applied to the NMOS transistor Mn1 as an inverted voltage through the negative feedback path and enters into the regeneration operation region formed between the time t2 and the time t3, for thus obtaining an accurate logic level of node N1 and of node N2.

These voltage levels $V_{N1}$, $V_{N2}$ generate the stable supply power control signals VOUT and VOUTB are generated by the CMOS buffer.

Figure 3:
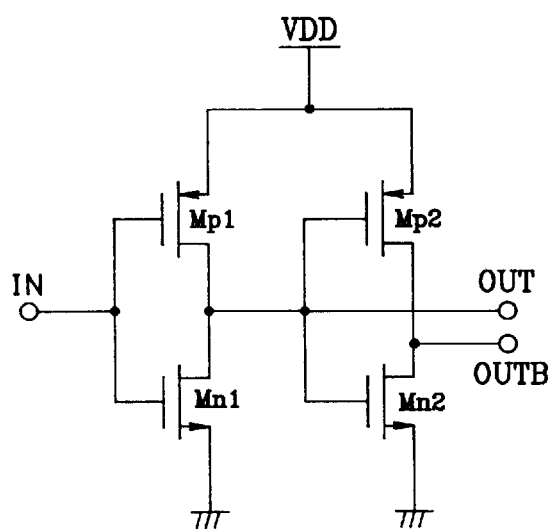
FIG. 3 is a circuit diagram illustrating a buffer circuit of an output terminal according to the present invention.
Figure 4A:
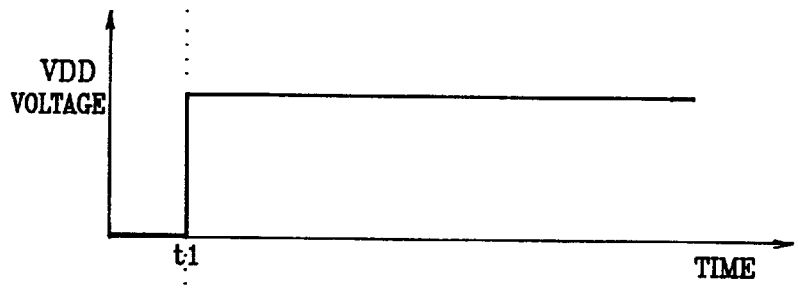
FIG. 4A through 4E are timing waveform diagrams of a signal from a power supply delay circuit according to the present invention.
Figure 4B:
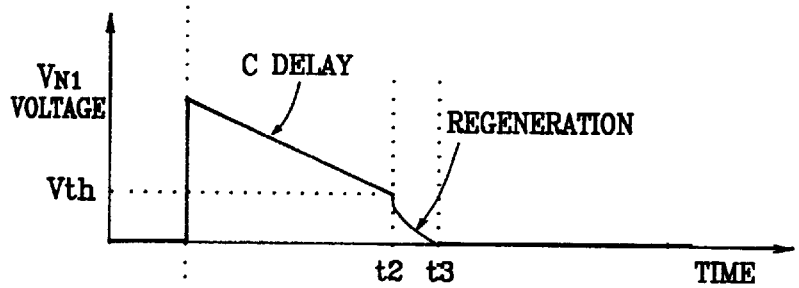
Figure 4C:
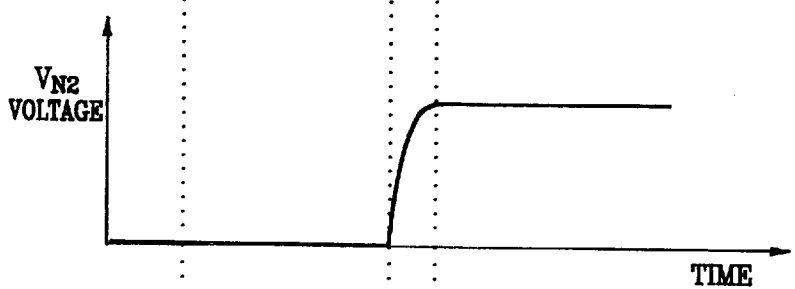
Figure 4D:
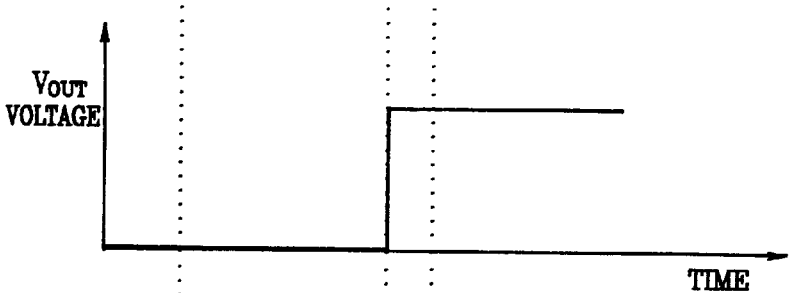
Figure 4E:
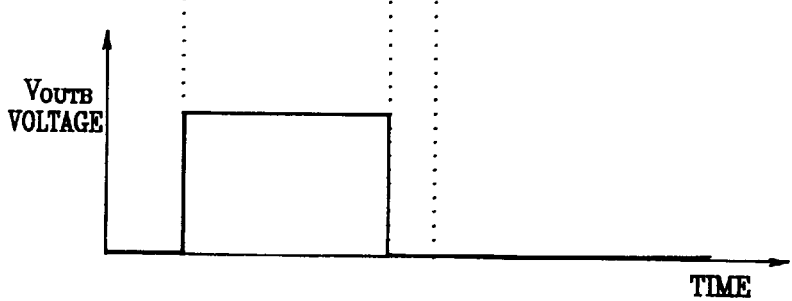

FIG. 3 is a circuit diagram illustrating a buffer circuit of an output terminal according to the present invention, and FIG. 4A through 4E are timing waveform diagrams of a signal from a power supply delay circuit according to the present invention.

With the above-described construction, in the present invention, when the power voltage VDD is supplied to the circuit, a stable supply power control signal voltage is generated after a delay operation to a time t2 in accordance with the current amount and the size of the capacitor.

As described above, the integrated circuit built-in type supply power delay circuit according to the present invention is basically directed to supplying a stable supply power to each circuit of the integrated circuit by generating a supply power control signal voltage after a predetermined time.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An integrated circuit built-in type supply power delay circuit comprising:
    means for supplying a voltage;
    means for charging responsive to the voltage supplied by said supply means and generating an output value;
    means for supplying a current;
    means for inverting the output value from said charging means and producing an inverted output value;
    switching means for selectively outputting the current from said current supply means, said switching means being controlled based on the inverted output value from said inverting means;
    current regenerating means for receiving the current output from said switching means and discharging the output value from said charging means;
    electric potential value conversion means for converting the output value from said charging means into a lower voltage level, said electric potential value conversion means being controlled by the inverted output value from said inverting means; and
    buffering means for buffering the inverted output value from said inverting means and outputting a non-inverted signal.

2. The circuit in accordance with claim 1, wherein said charging means comprises a PMOS transistor having a gate, a drain, and a source, the gate being connected to said voltage supply means and the source and drain being connected to one another for charging a voltage at the drain and source up to the voltage supplied by said voltage supply means.

3. The circuit in accordance with claim 1, wherein said current supply means comprises a PMOS transistor including a gate, a drain, and a source, the gate being connected to the drain and the source being connected to said supply voltage means.

4. The circuit in accordance with claim 1, wherein said switching means comprises a PMOS transistor including a gate connected to the inverted output of said inverting means, said PMOS transistor selectively outputting the current from said current supply means to said current regenerating means based on the inverted output value from said inverting means.

5. The circuit in accordance with claim 1, wherein said current regeneration means comprises:
    a first NMOS transistor including a gate connected to the output of said switching means, said first NMOS transistor discharging the output value from said charging means to approximately a ground voltage level based on the output of said switching means; and
    a second NMOS transistor including a gate connected to the output of said switching means, said second NMOS transistor discharging the output from said switching means to approximately a ground voltage level based on the output of said switching means.

6. The circuit in accordance with claim 1, wherein said electric potential conversion means comprises an NMOS transistor including a gate connected to the inverted output of said inverting means, said NMOS transistor converting the output value from said charging means to approximately a ground voltage level based on the inverted output value from said inverting means.

7. The circuit in accordance with claim 1, wherein said charging means has a charged current value based on characteristics of said current supply means, of said current regeneration means and said voltage supply means.

8. The circuit in accordance with claim 1, wherein said buffering means comprises:
    two CMOS inverters for outputting inverted and non-inverted signals.

9. The circuit in accordance with claim 7, wherein said inverting means comprises:
    an NMOS transistor having a threshold voltage; and
    a PMOS transistor;
    wherein the output value of said charging means is discharged at a steady rate until reaching a level approximately equal to the threshold voltage of said NMOS transistor of said inverting means.

* * * * *